(12) United States Patent  
Parker

(10) Patent No.: US 7,067,841 B2
(45) Date of Patent: Jun. 27, 2006

(54) ORGANIC ELECTRONIC DEVICES

(75) Inventor: Ian D. Parker, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 50 days.

(21) Appl. No.: 10/829,610

(22) Filed: Apr. 22, 2004

(65) Prior Publication Data

US 2005/0236614 A1  Oct. 27, 2005

(51) Int. Cl.
H01L 29/08 (2006.01)

(52) U.S. Cl. ............... 257/40; 257/40; 257/642

(58) Field of Classification Search .......... 257/40, 257/759, 642, 643
See application file for complete search history.

(56) References Cited

U.S. PATENT DOCUMENTS

| 5,435,887 | A | * | 7/1995 | Rothschild et al. ........... 216/26 |
| 6,048,573 | A | | 4/2000 | Tang et al. |
| 6,066,357 | A | | 5/2000 | Tang et al. |
| 6,087,196 | A | | 7/2000 | Sturm et al. |
| 6,277,679 | B1 | * | 8/2001 | Ohtani ........... 438/151 |
| 6,440,877 | B1 | | 8/2002 | Yamazaki et al. |
| 6,566,153 | B1 | | 5/2003 | Yang |
| 6,575,800 | B1 | | 6/2003 | Kobayashi et al. |
| 6,576,975 | B1 | | 6/2003 | Yang |
| 6,838,361 | B1 | * | 1/2005 | Takeo ........... 438/493 |
| 6,930,322 | B1 | * | 8/2005 | Mori ........... 257/40 |
| 2001/0001050 | A1 | | 5/2001 | Miyashita et al. |
| 2002/0197394 | A1 | | 12/2002 | Yamazaki et al. |
| 2003/0059975 | A1 | | 3/2003 | Sirringhaus et al. |
| 2003/0059984 | A1 | | 3/2003 | Sirringhaus et al. |
| 2003/0059987 | A1 | | 3/2003 | Sirringhaus et al. |
| 2003/0060038 | A1 | | 3/2003 | Sirringhaus et al. |
| 2003/0141810 | A1 | | 7/2003 | Kobayashi et al. |

FOREIGN PATENT DOCUMENTS

| EP | 0 989 778 A1 | 3/2000 |
| EP | 0 880 303 B1 | 1/2004 |
| WO | WO 99/21233 A1 | 4/1999 |

* cited by examiner

Primary Examiner—David Nelms
Assistant Examiner—Thinh T Nguyen

(57) ABSTRACT

Organic electronic devices are fabricated by a process includes forming an organic layer including: placing a first liquid composition over a first portion of a surface of a substrate without a well structure connected to or adjacent the first portion of the surface of the substrate, i) the first portion of the surface of the substrate has a first surface energy, ii) the first liquid composition includes a first liquid medium and iii) the first liquid composition has a second surface energy that is higher than the first surface energy; and evaporating the first liquid medium while the first liquid composition overlies the first portion of the surface of the substrate.

6 Claims, 4 Drawing Sheets

ORGANIC ELECTRONIC DEVICES

FIELD OF THE INVENTION

The invention relates generally to processes for forming organic layers, and more specifically to processes for forming organic layers and organic electronic devices and transistors having such organic layers.

BACKGROUND INFORMATION

Organic electronic devices have attracted increasing attention in recent years. Examples of organic electronic device include Organic Light Emitting Diodes (OLEDs). OLEDs are promising for display applications due to their high power conversion efficiency and low processing costs. When manufacturing full color displays, each display pixel can be divided into three subpixels, each emitting one of the three primary colors: red, green, and blue. In order to form pixels and subpixels having a pitch as small as 100 microns, geometric structures, such as banks or wells, are formed on the substrate to confine deposited OLED materials to certain locations on the substrate. Since these structures occupy space on the substrate, they reduce the effective emission area of the display, and can limit the resolution of a display.

Although ink-jet printing techniques are commonly used in the fabrication of electronic devices, high spatial resolution is difficult to achieve using these techniques. Using current ink-jet printing techniques, sub-pixels having sizes as small as approximately 85 microns have been attained. Future displays will require even smaller pixels and subpixels to improve resolution. Therefore, future high-resolution displays may not be able to use the banks or well structures or current ink-jet printing techniques.

SUMMARY OF THE INVENTION

The invention can include fabricating an organic electronic device array without the need for well structure(s) (e.g., side walls) by depositing an active layer material characterized by a higher surface energy than a substrate. Further, the invention can include lowering the surface energy of an active (e.g., electro luminescent) host substrate with a fluorine containing material before depositing (ink-jet printing) one or more additional active (e.g., electro luminescent) guest material(s), thereby fabricating an organic light emitting diode array of multiple colors with high resolution and precise pixel morphology, even in the absence of well structure(s).

According to an embodiment of the invention, a process of forming an organic layer comprises: placing a first liquid composition over a first portion of a surface of a substrate without a well structure connected to or adjacent the first portion of the surface of the substrate, wherein i) the first portion of the surface of the substrate has a first surface energy, ii) the first liquid composition includes a first liquid medium and iii) the first liquid composition has a second surface energy that is higher than the first surface energy; and evaporating the first liquid medium while the first liquid composition overlies the first portion of the surface of the substrate.

According to another embodiment of the invention, an organic electronic device comprises: a substrate having a surface with a first portion and a second portion, without a well structure connected to or adjacent the first portion of the surface or the second portion of the surface, wherein the first portion of the surface has a first surface energy and the second portion of the surface has a second surface energy; and a liquid composition covering the first portion of the surface and contacting the second portion of the surface, wherein the liquid composition has a third surface energy that is higher than the first surface energy and lower than the second surface energy.

According to another embodiment of the invention, a transistor comprises: an organic active layer on a portion of a surface of a substrate, without a well structure connected to or adjacent the portion of the surface of the substrate, wherein the organic active layer includes at least one feature selected from the group consisting of a concave surface and a cusp.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
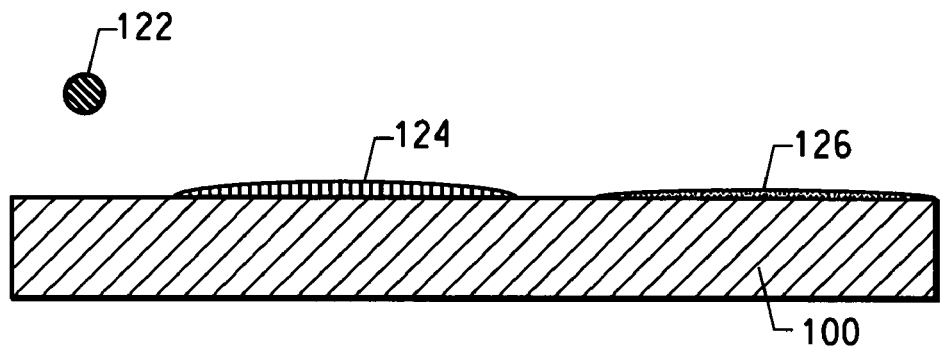
FIG. 1 includes an illustration of a cross-sectional view of a portion of a substrate after placing a drop of a liquid composition over a surface of the substrate, where the surface of the substrate has a higher surface energy compared to the surface of the drop.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Other features and advantages of the invention will be apparent from the following detailed description, and from the claims. The detailed description first addresses Definitions and Clarification of Terms followed by Surface Energy and Liquid Compositions, Full Color Display Using Host and Guest Materials, Other Organic Electronic Component Structures Formed Without Well Structures, Transistor Structures, Electronic Operation of the Organic Electronic Device, Advantages, and finally Examples.

1. Definitions and Clarification of Terms

Before addressing details of embodiments described below, some terms are defined or clarified. The terms "array," "peripheral circuitry" and "remote circuitry" are intended to mean different areas or components of the organic electronic device. For example, an array may include a number of pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "base material" is intended to mean the structural foundation on which an electronic device is fabricated. A substrate can include the base material in combination with other sub-components such as, for example, electrodes.

The term "concave" is intended to mean a shape, which from a cross-sectional view, is similar to an inner surface of a sphere or appears to approach an asymptote near an edge of the shape.

The term "continuous" when referring to a layer is intended to mean a layer that covers an entire substrate or portion of a substrate (e.g., the array) without any breaks in the layer. Note that a continuous layer may have a portion that is locally thinner than another portion and still be continuous if there is no break or gap in the layer.

The term "cusp" is intended to mean a rounded projection of a layer, member, or structure, having a shape that is convex and wherein the rounded projection can be adjacent or spaced apart from the layer, member, or structure on which it lies.

The term "filter" when referring to a layer material is intended to mean a layer or material separate from a radiation-emitting or radiation-receiving layer, wherein the filter is used to limit the wavelength(s) of radiation passing through such layer or material. For example, a red filter layer may allow substantially only red light from the visible light spectrum to pass through the red filter layer. Therefore, the red filter layer filters out green light and blue light.

The term "fluorinated", when used to describe an organic material, is intended to mean that at least one hydrogen atom of the organic material has been replaced with a fluorine atom.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "host material" is intended to mean a material, usually in the form of a layer, to which a guest material may be added. The host material may or may not have electronic characteristic(s) or the ability to emit, receive, or filter radiation.

The term "liquid composition" is intended to mean at least one condensed phase material that is dissolved in a liquid medium or media to form a solution, dispersed in a liquid medium or media to form a dispersion, or suspended in a liquid medium or media to form a suspension or an emulsion.

The term "organic active material" is intended to mean an organic material that can emit radiation, respond to radiation, filter radiation, form part of a diode, a transistor, or other electronic component.

The term "organic electronic device" is intended to mean a device including one or more organic active layers or materials. Organic electronic devices include: (1) devices that convert electrical energy into radiation (e.g., a light-emitting diode, light emitting diode display, flat panel light, or diode laser), (2) devices that generate signals based at least in part in response to environmental conditions and may or may not include electronics used for detection or to perform other logic operations (e.g., photodetectors (e.g., photoconductive cells, photoresistors, photoswitches, phototransistors, phototubes), IR detectors, biosensors), (3) devices that convert radiation into electrical energy (e.g., a photovoltaic device or solar cell), and (4) devices that include one or more electronic components that include one or more organic active layers (e.g., a transistor or diode).

The term "perfluorinated" alkyl, when used to describe an organic material, means that each and every hydrogen atom in the organic material has been replaced with a fluorine atom.

The term "precision deposition technique" is intended to mean a deposition technique that is capable of depositing one or more materials over a substrate at a dimension, as seen from a plan view of the substrate, no greater than approximately one millimeter. A nonlimiting example of a precision deposition technique is ink-jet printing. In general, a stencil mask, frame, well structure, patterned layer or other structure(s) may or may not be present during implementation of a precision deposition technique.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is a nonlimiting example of a radiation-emitting component.

The term "radiation-responsive component" is intended to mean an electronic component, which when exposed to radiation, produces carriers (i.e., electrons and holes). The radiation-responsive component may or may not be designed for radiation at a targeted wavelength or spectrum of wavelengths to be within the visible-light spectrum or outside the visible-light spectrum (UV or IR). IR sensors and photovoltaic cells are examples of radiation-responsive components.

The term "substantially free" when referring to a specific material is intended to mean that a trace amount of the specific material is present, but not in a quantity that significantly affects the electrical or radiative (emission, reception, transmission, or any combination thereof) properties of a different material in which the specific material resides.

The term "substantially liquid" when referring to a layer, material, or composition is intended to mean that a layer or material is in the form of a liquid, solution, dispersion, emulsion, suspension. A substantially liquid material can include one or more liquid media and, if overlying a substrate, is characterized by a viscosity that renders the layer, material or composition capable of flowing due to gravity when the substrate is placed on its side (primary overlaid surface of substrate oriented substantially perpendicular to the ground) for at least one hour at room temperature if not mechanically retained.

The term "substantially solid" when referring to a layer, material or composition is intended to mean that a layer or material is in the form of a solid state phase or phases. A substantially solid material can include one or more solid materials and, if overlying a substrate, is characterized by a viscosity that renders the layer, material or composition non-flowing due to gravity when the substrate is placed on its side (primary overlaid surface of substrate oriented substantially perpendicular to the ground) for at least one hour at room temperature in the absence of mechanical retention.

The term "substrate" is intended to mean a base material and all layer(s), member(s), and structure(s) mechanically coupled to the base material at a particular point in a process. For example, before any processing occurs, the substrate and the base material may be the same. However, before forming an organic active layer, a substrate may include the base material, first electrodes, and a charge transport layer.

The term "well structure" refers to a structure used to confine a liquid during processing and prevent flowing. A well structure can include a wall, web, dam, divider or frame.

The term "plurality" is intended to mean two or more than two. The term "another" is intended to mean at least a second or more. The terms "consisting" (consists, consisted) and/or "composing" (composes, composed) are intended to mean close language that does not leave the recited method, apparatus or composition to the inclusion of procedures, structure(s) and/or ingredient(s) other than those recited except for ancillaries, adjuncts and/or impurities ordinarily associated therewith. The recital of the term "essentially" along with the terms "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition. The term "coupled" is intended to mean connected, although not necessarily directly, and not necessarily mechanically. The term "any" is intended to mean all applicable members of a set or at least a subset of all applicable members of the set. The term "approximately" is intended to mean at least close to a given value (e.g., within 10% of). The term "substantially" is intended to mean largely but not necessarily wholly that which is specified. The term "generally" is intended to mean at least approaching a given state. The term "deploying" is intended to mean designing, building, shipping, installing and/or operating. The term "means" when followed by the term "for" as used herein, is defined as hardware, firmware and/or software for achieving a result.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the CRC Handbook of Chemistry and Physics, $81^{st}$ Edition (2000).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

2. Surface Energy and Liquid Compositions

Figure 2:
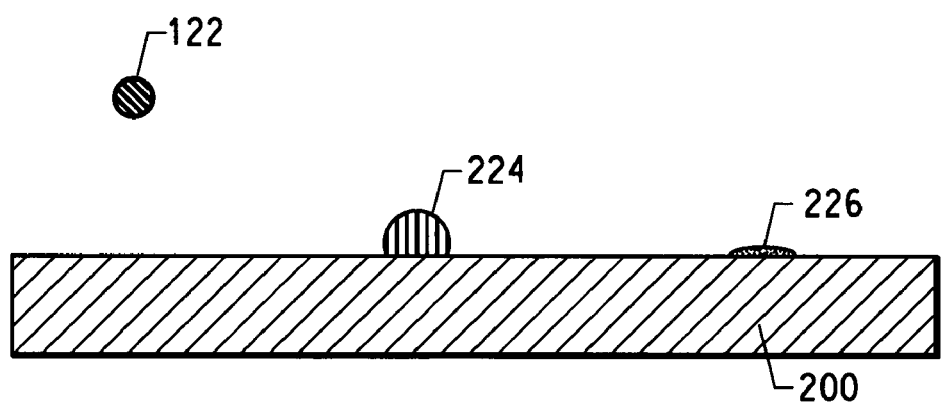
FIG. 2 includes an illustration of a cross-sectional view of a portion of a substrate after placing a drop of a liquid composition over a surface of the substrate, where the surface of the substrate has a lower surface energy compared to the surface of the drop.

FIGS. 1 and 2 demonstrate the interaction of substrates and liquid compositions when the substrates have different surface energies. The surface energy of the drop 122 of a liquid composition is approximately 30 mN/m. The liquid composition includes a liquid medium or media and potentially at least one material that is dissolved, suspended, or dispersed within or forms an emulsion with the liquid medium or media. As used hereinafter, "liquid medium" is used regardless whether one or more liquid media can or is used.

Referring to FIG. 1, the surface energy of substrate 100 is higher than the surface energy of the drop 122. For example, the surface energy at the exposed surface of the substrate 100 may be approximately 65 mN/m. Because the surface energy of the substrate 100 is higher than the surface energy of the drop 122, the drop 122 will spread out over the surface of the substrate 100 resulting in a pool 124 in FIG. 1. The liquid medium may be evaporated resulting in the layer 126, which may have a diameter, when seen from a plan view of the substrate 100, of 81 microns or potentially larger.

Referring to FIG. 2, the surface energy of substrate 200 is lower than the surface energy of the drop 122. For example, the surface energy at the exposed surface of the substrate 200 may be approximately 25 mN/m. Substrate 200 may include a fluorine-containing material or the exposed surface may have been exposed to a fluorine-containing gas or a surfactant. Because the surface energy of the substrate 200 is lower than the surface energy of the drop 122, the drop 122 will retain a shape 224 as illustrated in FIG. 2. The liquid medium may be evaporated resulting in the layer 226, which may have a diameter, when seen from a plan view of the substrate 200, of approximately 15 microns or potentially smaller.

The actual materials and properties for the substrate 200 and liquid compositions can vary. The surface energy for the exposed surface of the substrate 200 is typically no greater than about 30 mN/m because the liquid composition 122 may have a liquid medium with a surface energy of approximately 30 mN/m. If the surface energy of the liquid medium of liquid composition 122 is higher than 30 mN/m, the surface energy of the substrate 200 can be higher than 30 mN/m as long as the surface energy of the exposed surface of the substrate 200 is lower than the surface energy of the liquid medium within the liquid composition 122. Other factors including viscosity, concentration of guest or other materials within the liquid composition, solubility of the liquid medium with substrate materials, temperature, drop size, and potentially other factors may affect the amount of lateral spreading of a drop after it is placed over the substrate 200.

Substrate 200 may include a base material, by itself, or a layer, member, other structure, or any combination thereof over the base material. The base material may be rigid or flexible and include glass, ceramic, metallic, or polymeric film(s), or any other materials used when forming organic electronic components for the organic electronic device. In one embodiment, the surface of the substrate 200 may include a material that inherently has a low surface energy. Examples include charge transfer layers (e.g., a conductive polymer complexed with a water-insoluble colloid-forming polymeric acid), organic active materials (e.g., fluorinated polyfluorenes, fluorinated polspirofluorenes, fluorinated poly(phenylenevinylene) ("PPV")), fluorinated dielectrics (e.g. organic or inorganic), and any combination thereof.

Alternatively, a surfactant may be added into a film during its preparation or during subsequent coating (e.g., spin coating). Surfactants include fluoropolymer and fluorochemical additives such as DuPont Zonyl® Fluoroadditives. When added into a film at low concentrations, for instance about 0.001 to 1 percent, a fluorinated surfactant can lower the surface energy of the film to the desired level. As a separate layer, the surfactant can be as thin as a few monolayers. An upper limit on the thickness of a separate surfactant layer is dependent on how a particular surfactant layer might influence the performance of the electronic device.

In still another embodiment, the surface of the substrate 200 may be exposed to a fluorine-containing fluid. In one specific embodiment, the substrate 200 may be exposed to a fluorine-containing plasma. The plasma may be generated from one or more fluorine-containing gases selected from a group consisting of alkyl fluorides having one or two carbon atoms (e.g., $CF_4$, $CHF_3$, $C_2F_6$, etc.), $SF_6$, $NF_3$, HF, $F_2$, and combinations thereof. The plasma may also help to passivate the surface to reduce the likelihood corrosion of metals (e.g., aluminum, etc.), saturate dangling bonds, reduce traps or interface states (dielectrics in transistor structures), or other reasons not directly related to surface energy.

After reading this specification, skilled artisans will appreciate that the concepts described herein may be used in a wide variety of different applications. In one embodiment, the substrate 200 may have a fluorinated charge transfer layer, such as a conductive polymer complexed with a water-insoluble colloid-forming polymeric acid. The liquid composition(s) may include a liquid medium and organic active material(s). In another embodiment, the substrate 200 may include a fluorinated host material and the liquid composition may include a liquid medium and guest material(s), the host material, or a combination thereof. In still another embodiment, the substrate 200 may include a fluorinated polymer film as part of a filter layer and the liquid composition may include a liquid medium and dye(s).

In a further embodiment, the substrate 200 may include a metal electrode that has been passivated with a fluorine-containing plasma, and the liquid composition may include a liquid medium and organic active material(s) for or a channel region of a junction field-effect transistor ("JFET") or a base region of a bipolar transistor. In still a further embodiment, the substrate 200 may include a gate dielectric layer and a low surface energy surfactant (e.g., non-metallic fluorine-containing material, such as $NH_4F$) overlying portions of the gate dielectric layer where a channel region is not to be formed, and the liquid composition may include a liquid medium and organic active material(s) for the channel region of a metal-insulator-semiconductor ("MISFET")). In yet another further embodiment, the substrate 200 may include spaced-apart source and drain electrodes, an insulating layer lying between the source and drain electrodes, and a low surface energy surfactant (e.g., non-metallic fluorine-containing material, such as $NH_4F$) overlying portions of the source and drain electrodes and insulating layer where a channel region is not to be formed, and the liquid composition may include a liquid medium and organic active material(s) for a channel region of a JFET or MISFET. Other electronic structures, such as diodes, capacitors, and resistors may be likewise formed. To list every conceivable application would be nearly impossible. After reading the specification, skilled artisans will appreciate that the applications described herein are merely exemplary and do not limit the scope of the claimed invention.

For a radiation-emitting organic active layer, suitable radiation-emitting host materials include one or more fluorinated small molecule materials, one or more fluorinated polymeric materials; or a combination thereof. Examples of such polymers include fluorinated PPV, fluorinated PPV copolymers, fluorinated polyfluorenes, fluorinated polyphenylenes, fluorinated polyacetylenes, fluorinated polyalkylthiophenes, fluorinated poly(n-vinylcarbazole) (PVK), and the like. In one specific embodiment, the radiation-emitting semiconductor layer without any guest materials emits blue light.

For an organic active layer capable of responding to radiation, suitable host materials include many fluorinated conjugated polymers and electroluminescent materials. Such materials include for example, many conjugated polymers and electro- and photo-luminescent materials. Specific examples include fluorinated poly(2-methoxy,5-(2-ethyl-hexyloxy)-1,4-phenylene vinylene) ("MEH-PPV") and MEH-PPV composites with CN-PPV.

For a filter layer, the location of a filter layer is typically between an organic active layer and a user side of the organic electronic device. A filter layer may be part of a substrate, an electrode (e.g., an anode or a cathode), a charge transport layer; lie between any one or more of the substrate, electrodes, charge transport layer; or any combination thereof.

When the filter layer is part of the substrate or lies between the substrate and an electrode closest to the substrate, suitable host materials includes many different organic materials including polyolefins (e.g., polyethylene or polypropylene); polyesters (e.g., polyethylene terephthalate or polyethylene naphthalate); polyimides; polyamides; polyacrylonitriles and polymethacrylonitriles; perfluorinated and partially fluorinated polymers (e.g., polytetrafluoroethylene or copolymers of tetrafluoroethylene and polystyrenes); polycarbonates; polyvinyl chlorides; polyurethanes; polyacrylic resins, including homopolymers and copolymers of esters of acrylic or methacrylic acids; epoxy resins; Novolac resins; and combinations thereof.

When the filter layer is part of the hole-transport layer, suitable host materials include polyaniline ("PANI"), poly (3,4-ethylenedioxythiophene) ("PEDOT"), organic charge transfer compounds, such as tetrathiafulvalene tetracyanoquinodimethane (TTF-TCQN), hole-transport materials as described in U.S. Pat. No. 6,459,199 ("Kido"), and combinations thereof.

When the filter layer is part of the electron-transport layer, suitable host materials include metal-chelated oxinoid compounds (e.g., $Alq_3$); phenanthroline-based compounds (e.g., 2,9-dimethyl-4,7-diphenyl-1,10-phenanthroline ("DDPA"), 4,7-diphenyl-1,10-phenanthroline ("DPA")); azole compounds (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); electron-transport materials as described in Kido; and combinations thereof.

For a transistor, a channel region or base region may include one or more of thiophenes (e.g., polythiophene, poly(alkylthiophene), alkylthiophene, bis (dithienthiophene), alkylanthradithiophene, etc.), polyacetylene, pentacene, phthalocyanine, and combinations thereof.

One or more organic active materials may be used in the liquid compositions. Organic active materials can include organometallic materials, such as functionalized polymers comprising functional groups coordinated to at least one metal. Exemplary functional groups contemplated for use include carboxylic acids, carboxylic acid salts, sulfonic acid groups, sulfonic acid salts, groups having an OH moiety, amines, imines, diimines, N-oxides, phosphines, phosphine oxides, β-dicarbonyl groups, and combinations thereof. Exemplary metals contemplated for use include lanthanide metals (e.g., Eu, Tb), Group 7 metals (e.g., Re), Group 8 metals (e.g., Ru, Os), Group 9 metals (e.g., Rh, Ir), Group 10 metals (e.g., Pd, Pt), Group 11 metals (e.g., Au), Group 12 metals (e.g., Zn), Group 13 metals (e.g., Al), and combinations thereof. Further typical organometallic guest materials contemplated for use are disclosed in Published PCT Application WO 02/31896.

Guest materials can include any one or more of all known materials used for an electroluminescent layer, charge transport (e.g., hole transport, electron transport) layer, or other materials used for organic active layer and their corresponding dopants. Such guest materials can include organic dyes, organometallic materials, polymers (conjugated, partially conjugated, or non-conjugated), and combinations thereof. The guest materials may or may not have fluorescent or phosphorescent properties.

Examples of the organic dyes include 4-dicyanmethylene-2-methyl-6-(p-dimethyaminostyryl)-4H-pyran (DCM), coumarin, pyrene, perylene, rubrene, derivatives thereof, and combinations thereof.

Examples of organometallic materials include functionalized polymers comprising functional groups coordinated to at least one metal. Exemplary functional groups contemplated for use include carboxylic acids, carboxylic acid salts, sulfonic acid groups, sulfonic acid salts, groups having an OH moiety, amines, imines, diimines, N-oxides, phosphines, phosphine oxides, p-dicarbonyl groups, and combinations thereof. Exemplary metals contemplated for use include lanthanide metals (e.g., Eu, Tb), Group 7 metals (e.g., Re), Group 8 metals (e.g., Ru, Os), Group 9 metals (e.g., Rh, Ir), Group 10 metals (e.g., Pd, Pt), Group 11 metals (e.g., Au), Group 12 metals (e.g., Zn), Group 13 metals (e.g., Al), and combinations thereof. Such organometallic materials include metal chelated oxinoid compounds, such as tris(8-hydroxyquinolato)aluminum ($Alq_3$); cyclometalated iridium and platinum electroluminescent compounds, such as complexes of iridium with phenylpyridine, phenylquinoline, or phenylpyrimidine ligands as disclosed in Published PCT Application WO 02/02714, and organometallic complexes described in, for example, published applications U.S. 2001/0019782, EP 1191612, WO 02/15645, WO 02/31896, and EP 1191614; and mixtures thereof.

Examples of conjugated polymers include poly(phenylenevinylenes), polyfluorenes, poly(spirobifluorenes), copolymers thereof, and mixtures thereof.

When used for the production of full color organic electronic devices, a blue host material can emit blue light (with an emission maximum in a range of approximately 400–500 nm), a first guest material is selected to emit red light (with an emission maximum in a range of approximately 600–700 nm) and a second guest material is selected to emit green light (with an emission maximum in a range of approximately 500–600 nm). After deposition of each of the host and guest materials, each pixel column contains three subpixels wherein one subpixel emits red light, one subpixel emits green light, and one subpixel emits blue light.

A liquid medium is used in the liquid compositions. The liquid medium typically has a higher surface energy than the organic layer. In addition, a liquid medium contemplated for use in the practice of the invention is chosen so as to provide proper solution characteristics for both the guest material and the organic layer that receives the guest material. Factors to be considered when choosing a liquid medium include, for example, viscosity of the resulting solution, emulsion, suspension, or dispersion, molecular weight of a polymeric material, solids loading, type of solvent, temperature of an underlying substrate, thickness of an organic layer that receives a guest material, or any combination thereof.

When selecting a liquid medium, such liquid medium may form a solution, emulsion, suspension, or dispersion with one type of organic layer but not necessarily form a solution, emulsion, suspension, or dispersion with another type of organic layer.

In some embodiments, the liquid medium includes at least one organic solvent. Exemplary organic solvents include halogenated solvents, hydrocarbon solvents, aromatic hydrocarbon solvents, ether solvents, cyclic ether solvents, alcohol solvents, ketone solvents, nitrile solvents, sulfoxide solvents, amide solvents, and combinations thereof.

Exemplary halogenated solvents include carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, and combinations thereof.

Exemplary hydrocarbon solvents include pentane, hexane, cyclohexane, heptane, octane, decahydronaphthalene, petroleum ethers, ligroine, and combinations thereof.

Exemplary aromatic hydrocarbon solvents include benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, and combinations thereof.

Exemplary ether solvents include diethyl ether, ethyl propyl ether, dipropyl ether, disopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, and combinations thereof.

Exemplary cyclic ether solvents suitable include tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, and combinations thereof.

Exemplary alcohol solvents include methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, and combinations thereof.

Alcohol ether solvents may also be employed. Exemplary alcohol ether solvents include 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, and combinations thereof.

Exemplary ketone solvents include acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, and combinations thereof.

Exemplary nitrile solvents include acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, and combinations thereof.

Exemplary sulfoxide solvents suitable include dimethyl sulfoxide, di-n-butyl sulfoxide, tetramethylene sulfoxide, methyl phenyl sulfoxide, and combinations thereof.

Exemplary amide solvents suitable include dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, and combinations thereof.

Crown ethers contemplated include all crown ethers which can function to assist in the reduction of the chloride content of an epoxy compound starting material as part of the combination being treated according to the invention. Exemplary crown ethers include benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; and combinations thereof.

In another embodiment, the liquid medium includes water. A conductive polymer complexed with a water-insoluble colloid-forming polymeric acid can be deposited over a substrate and used as a charge transport layer.

Many different classes of liquid media (e.g., halogenated solvents, hydrocarbon solvents, aromatic hydrocarbon solvents, water, etc.) are described above. Mixtures of two or more liquid media from different classes may also be used.

3. Full Color Display Using Host and Guest Materials

Figure 3:
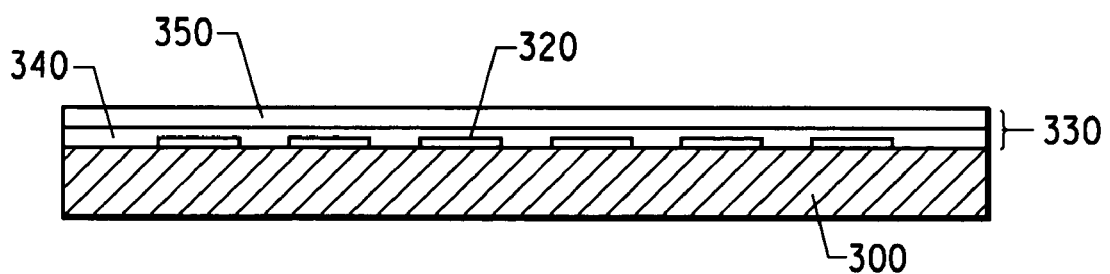
FIG. 3 includes an illustration of a cross-sectional view of a portion of a substrate including first electrodes and an organic layer.

Referring to FIG. 3, first electrodes 320 are formed over portions of a base material 300. The base material 300 may be a conventional base material as used in the organic electronic device arts. The base material 300 can be flexible or rigid, organic or inorganic. Generally, glass or flexible organic films are used. Pixel driver and other circuits are formed within or over the base material 300 using conventional techniques. The other circuits (not shown) outside the array include peripheral and remote circuitry used to control the pixels within the array. The focus of fabrication is on the pixel array rather than the peripheral or remote circuitry. The base material 300 has a thickness in a range of approximately 12–250 microns.

The first electrodes 320 act as anodes and may include one or more conductive layers. The surface of the first electrodes 320 furthest from the base material 300 includes a high work function material (>4.4 eV). The first electrodes 320 include one or more of layers of indium tin oxide, aluminum tin oxide, or other materials conventionally used for anodes within organic electronic devices. In this embodiment, the first electrodes 320 transmit at least 70% of the targeted radiation to be emitted from or received by subsequently formed organic semiconductor layer(s). In one embodiment, the thickness of the first electrodes 320 is in a range of approximately 100–200 nm. If radiation does need to be transmitted through the first electrodes 320, the thickness may be greater, such as up to 1000 nm or even thicker.

The first electrodes 320 are formed using one or more of any number of different techniques including a conventional coating (e.g., spin coating), vapor deposition (chemical or physical), printing (ink jet printing, screen printing, solution dispensing, or any combination thereof, other deposition technique, or any combination thereof. In one embodiment, the first electrodes 320 are formed as a patterned layer (e.g., using a stencil mask) or by depositing the layer(s) over all the base material 300 and using a conventional patterning sequence.

An organic layer 330 is formed over the first electrodes 320 as illustrated in FIG. 3. The organic layer 330 includes one or more layers. For example, the organic layer 330 may include a charge transport layer 340 and an organic active layer 350, charge transport layers may lie along both sides of the organic active layer 350, the charge transport layer may overlie rather than underlie the organic active layer 350, or the organic active layer 350 may be used without the charge transport layer 340. When the charge transport layer 340 lies between the first electrodes 320 and the organic active layer 350, the charge transport layer 340 will be a hole-transport layer, and when the charge transport layer lies between the organic active layer 350 and subsequently formed second electrode(s) that act as cathodes, the charge transport layer (not shown in FIG. 3) will be an electron-transport layer. The embodiment as shown in FIG. 3 has the charge transport layer 340 that acts as the hole-transport layer.

The charge transport layer 340 and the organic active layer 350 are formed sequentially over the first electrodes 320. In addition to facilitating transport of charge from the first electrodes 320 to the organic active layer 350, the charge transport layer 340 may also function as a charge injection layer facilitating injection of charged carriers into the organic active layer 350, a planarization layer over the first electrodes 320, a passivation or chemical barrier layer between the first electrodes 320 and the organic active layer 350, or any combination thereof. Each of the charge transport layer 340 and the organic active layer 350 can formed using one or more of any number of different techniques including a conventional coating (e.g., spin coating), vapor deposition (chemical or physical), printing (ink jet printing, screen printing, solution dispensing, or any combination thereof), other deposition technique, or any combination thereof. One or both of the charge transport layer 340 and the organic active layer 350 may be cured after application.

When the charge transport layer 340 acts as a hole-transport layer, it includes one or more of PANI, PEDOT, or other material(s) conventionally used as hole-transport layers as used in organic electronic devices. The hole-transport layer has a thickness in a range of approximately 100–250 nm as measured over the base material 300 at a location spaced apart from the first electrodes 320.

The composition of the organic active layers 350 typically depends upon the application of the organic electronic device. In FIG. 3, the organic active layer 350 is used in radiation-emitting components. The organic active layer 350 includes material(s) as conventionally used as organic active layers in organic electronic devices and can include one or more small molecule materials, one or more polymer materials, or any combination thereof. After reading this specification, skilled artisans will be capable of selecting appropriate material(s), layer(s) or both for the organic active layer 350.

As formed, the organic layer 330 (including charge transport layer 340 and organic active layer 350) are substantially continuous over an array of organic electronic components to be formed. In one embodiment, the organic layer 330 may be substantially continuous over the entire base material, including the peripheral and remote circuitry areas. Note that the organic layer 330 has regions where the organic layer 330 is locally thinner, but it is not discontinuous over the area of the base material 300 over which the organic layer 330 is intended to be formed. Referring to FIG. 3, the organic layer 330, including one or both of the charge transport layer 340 and the organic active layer 350, is locally thinner over the first electrodes 320 and locally thicker away from the first electrodes 320. The organic active layer 330 typically has a thickness in a range of approximately 50–500 nm as measured over the base material 300 at a location spaced apart from the first electrodes 320.

Although not shown, an optional charge transport layer that acts as an electron-transport layer may be formed over the organic active layer 350. The optional charge transport layer includes at least one of aluminum tris(8-hydroxyquinoline) or other material conventionally used as electron-transport layers in organic electronic devices. The optional charge transport layer is formed using one or more of any number of different techniques including a conventional coating (e.g., spin coating), vapor deposition (chemical or physical), printing (ink jet printing, screen printing, solution dispensing, or any combination thereof), other deposition technique, or any combination thereof of appropriate materials as described below. The electron-transport layer has a thickness in a range of approximately 30–500 nm as measured over the base material 300 at a location spaced apart from the first electrodes 320.

In an alternative embodiment, the organic layer 330 includes a single layer with a composition that varies with thickness. For example, the composition nearest the first electrodes 320 acts as a hole transporter, the next composition acts as an organic active layer, and the composition furthest from the first electrodes 320 acts as an electron transporter. One or more materials can be present throughout all or only part of the thickness of the organic layer. As shown in FIG. 3, after forming the organic layer 330, the substrate may include the base material 300, first electrodes 320, and the organic layer 330.

Low surface energy organic layers are obtained by utilizing the fluorinated polymeric materials described herein. In alternative embodiments, the organic layer may be fluorinated after deposition onto a base material and prior to receiving the liquid compositions. Fluorination of an organic layer can be accomplished, for example, by treatment with fluorinated fluids as previously described. Alternatively, a surfactant may be used.

Figure 4:
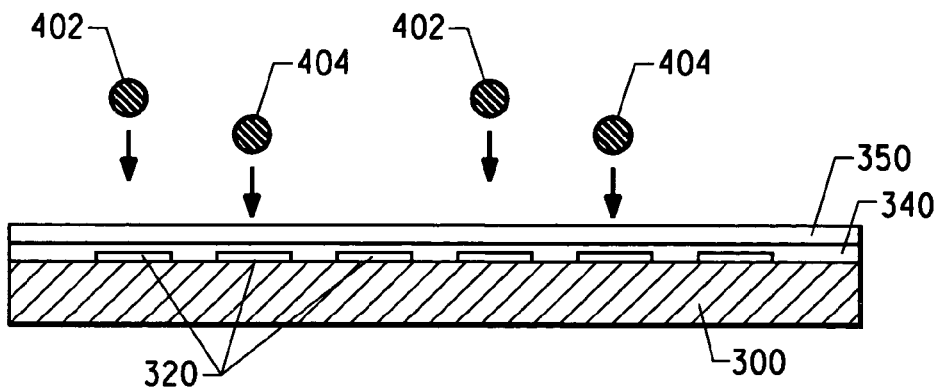
FIG. 4 includes an illustration of the substrate of FIG. 3 as guest materials are placed over the organic layer.

One or more liquid compositions, illustrated as circles 402 and 404 in FIG. 4, are placed over the substrate including organic layer 330 using a precision dispensing system, such as an inkjet printer. The liquid compositions 402 and 404 may be placed over the organic layer 330 sequentially or simultaneously. For simplicity, each of the liquid compositions 402 and 404 in FIG. 4 are referred to as "drops," whether or not the liquid compositions 402 and 404 are introduced as drops. The surface energy of substrate, which now includes the organic active layer 350 along its exposed surface, is lower than the surface energy of the liquid medium for drops 402 and 404. In one embodiment, the organic active layer 350 includes a blue host material, drops 402 can include a red guest material, and drops 404 can include a green guest material. Before the placement, the organic layer 330 may or may not be substantially solid. A number of parameters can be varied that affect the initial area of the organic layer 330 affected by the drops 402 and 404. For example, such parameters are selected from a group consisting of drop volume, spacing between organic electronic components, drop viscosity, and any combination thereof.

Figure 5:
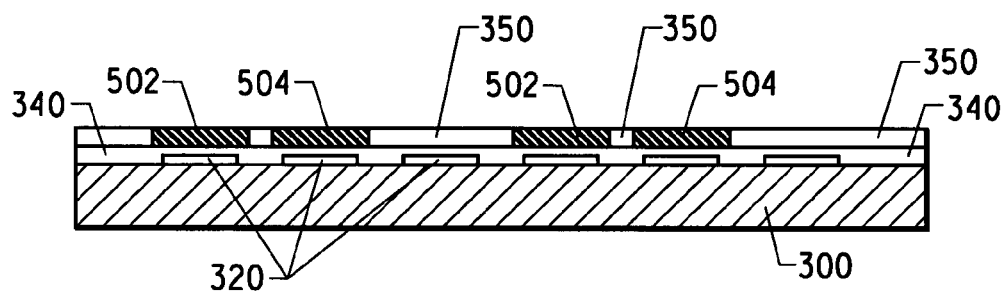
FIG. 5 includes an illustration of the substrate of FIG. 4 after the guest materials have migrated into the organic layer.

The liquid medium from the drops 402 and 404 have a higher surface energy than the underlying organic layer. As the liquid medium from each drop contacts the substrate at the low surface energy organic active layer 350, the lower surface energy of the organic active layer 350 constrains the drop as it migrates into the organic active layer 350, thereby minimizing lateral spreading of the composition on the surface of the organic layer. Referring to FIG. 5, regions 502 and 504 are formed from drops 402 and 404, respectively. In some embodiments, the liquid media from the drops 402 and 404 have surface energies in a range of approximately 18–30 mN/m. Use of a low surface energy organic active layer 350 can confine spreading of drops to approximately 15 microns. As a result, spacing between drops may be in a range of approximately 25–100 microns.

The liquid medium from the drops 402 and 404 is evaporated. In this embodiment, region 502 is designed to emit or respond to red light, and region 504 is designed to emit or respond to green light. The evaporation may be performed at a temperature in a range of approximately 20–240° C. for a time in a range of approximately 5 seconds to 5 minutes. In one embodiment, the evaporation is performed at a temperature in a range of approximately 30–50° C. for a time in a range of approximately 0.5–1.5 minutes. The evaporation may be performed using an oven or a hot plate. The evaporation may be performed using a variety of pressures. In one embodiment, the evaporation maybe performed at substantially atmospheric pressure. In another embodiment, a vacuum pressure (significantly lower than atmospheric pressure) may be used. If a vacuum is used, care should be used to avoid generating permanent bubbles within the organic layer 330 or spewing material to adjacent areas if boiling occurs. After evaporation, the organic layer 330, including regions 504 and 505 are substantially solid.

If the organic active layer 350 comprises host material(s) that are to be cross-linked, the organic active layer 350 can be formed by coating (e.g., spin coating), or other liquid-phase process. A heating step is used to evaporate the liquid medium used during the formation step to make the organic active layer 350 substantially solid. However, the temperature or other conditions should not be so aggressive such that cross-linking occurs. The liquid composition(s) is placed over the organic active layer 350, and guest material(s) within the composition(s) can migrate into the organic active layer 350. The liquid medium for the liquid compositions can be evaporated, and the organic active layer 350 may be subjected to the conditions sufficient to achieve the cross-linking. Actual temperatures and pressure used may depend on the materials used for cross-linking.

The concentration of guest material within the regions 502 and 504 are significantly more uniform than if a diffusion process using a conjugated polymer ink is performed. The liquid medium helps to "pull" the guest material into the organic layer 330 as a solution, emulsion, dispersion, or suspension, which is formed by a combination of the liquid medium and organic layer 330. Therefore, most of the guest material(s) within the liquid composition(s) migrates towards the first electrodes 320 without substantial lateral migration or diffusion. The concentration of the guest material(s) near the surface of the organic layer 330 (over which second electrode(s) is (are) subsequently formed) can be less than an order of magnitude different from the concentration of the guest material(s) near the opposite surface (near the first electrodes 320). The concentrations of the guest material(s) near the opposite sides of the organic active layer 350 are closer to each other. A thermal drive step is not required. The concentration gradient between the first electrodes 320 and a subsequently formed second electrode (concentration gradient measured in a direction perpendicular to the primary surface of the substrate) is lower than a concentration gradient for a similar layer formed by a conventional thermal diffusion process. The emission spectra from an organic electronic device formed by the technique described herein may not be significantly affected by changing the potential difference between the first and second electrodes.

Figure 6:
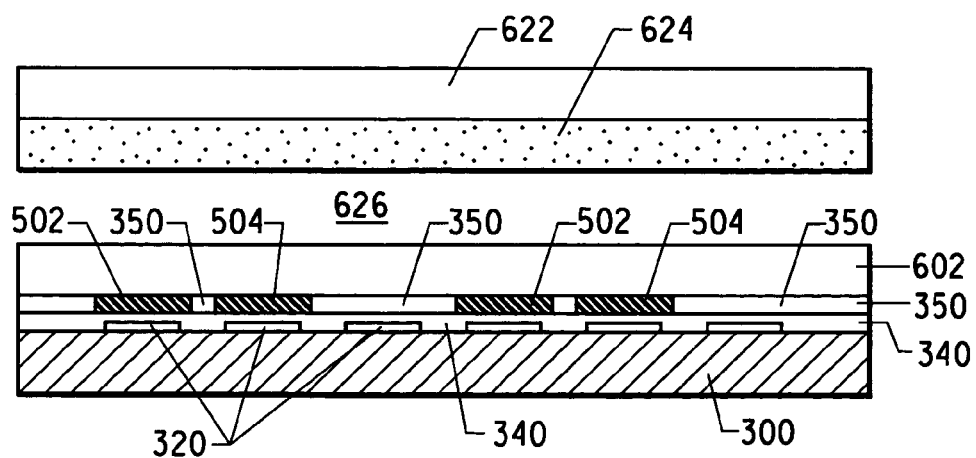
FIG. 6 includes an illustration of the substrate of FIG. 5 after forming a substantially completed organic electronic device.

A second electrode 602 is formed over the organic layer 330 including charge transport layer 340 and the organic active layer 350 as illustrated in FIG. 6. In this specific embodiment, the second electrode 602 may act as a common cathode for an array. The surface of the second electrode 602 includes a low work function material. The second electrode 602 includes one or more of a Group 1 metal, Group 2 metal, or other materials conventionally used for cathodes within organic electronic devices.

The second electrode 602 is formed using one or more of any number of different techniques including a conventional coating (e.g., spin coating), vapor deposition (chemical or physical), printing (ink jet printing, screen printing, solution dispensing, or any combination thereof), other deposition technique, or any combination thereof. The second electrode 602 may be formed as a patterned layer (e.g., using a stencil mask) or by depositing the layer(s) over all the array and using a conventional patterning sequence. The second electrode 602 has a thickness in a range of approximately 100–1000 nm.

Other circuitry not illustrated in FIG. 6 can be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers. Alternatively, such circuitry may be formed before, during, or after the formation of any layers illustrated in FIG. 6.

A lid 622, with a desiccant 624, is attached to the base material 300 at locations (not shown) outside the array to form a substantially completed device. A gap 626 lies between the second electrode 602 and the desiccant 624. The materials used for the lid 622 and desiccant 624 and the attaching process are conventional.

FIG. 6 includes two pixels that each have red, green, and blue radiation-emitting components. The red radiation-emitting components include the red-doped regions 502, and the green radiation-emitting components include the green-doped regions 504, and the blue radiation-emitting components include undoped portions (substantially free of the red and green guest materials) of the organic active layer 350 lying between two of the first electrodes 320 and the second electrode 602.

4. Other Organic Electronic Component Structures Formed Without Well Structures

Figure 7:
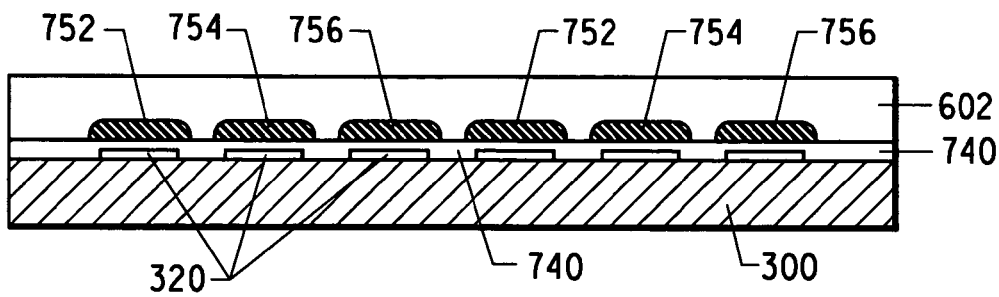
FIG. 7 includes an illustration of a cross-sectional view of a portion of a substrate after forming spaced-apart organic layers without the use of well structures.

Organic electronic devices can be formed over a layer without the need of well structures. In FIG. 7, organic active layers 752, 754, and 756 can be formed at tight pitches. The surface of the charge transport layer 740 has a lower surface energy compared to the surface of the liquid medium for the organic active layers 752, 754, and 756 (formed from the same or different liquid compositions). The lower surface energy of the charge transport layer 740 constrains the liquid compositions for the organic active layers 752, 754, and 756 to allow the organic active layers to have widths in a range of approximately 4–70 µm and lengths of nearly any size.

The spacing between the neighboring organic active layer 752, 754 and 756 can be 5–70 µm.

In still another embodiment, a filter layer can lie between an organic active layer and a user side of the organic electronic device. The filter layer allows radiation at a wavelength or spectrum of wavelengths to be transmitted through the filter layer. The filter layer does not allow a significant amount of radiation outside such wavelength or spectrum of wavelengths to be transmitted. Therefore, the filter layer can "block" radiation at undesired wavelengths.

Figure 8:
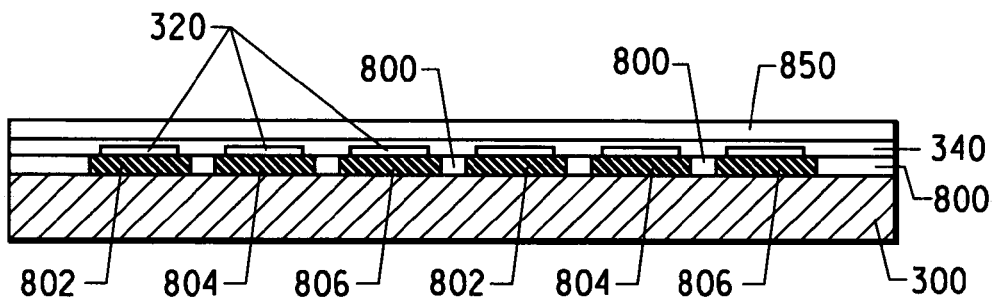
FIG. 8 includes an illustration of a cross-sectional view of a portion of a substrate, a filter layer including guest materials, first electrodes, and an organic layer.

An organic layer 800 is formed over the base material 300 as illustrated in FIG. 8. The organic layer 800 may include one or more layers of nearly any organic material (e.g., a polymeric film) that is used to form part of the base material 300. The organic layer 800 may theoretically have nearly any thickness (1 nm to several hundreds of microns or more). However, when the thickness is too thin, the filter layer may not be sufficient to provide a good quality filter layer. At the other end of the range, as the filter layer becomes thicker, transmission of radiation through the filter layer is reduced. In one embodiment, the organic layer 800 has a thickness in a range of approximately 1–10 microns.

The organic layer 800 can be formed using one or more of any number of different techniques including a conventional coating (e.g., spin coating), vapor deposition (chemical or physical), printing (ink jet printing, screen printing, solution dispensing, or any combination thereof), other deposition technique, or any combination thereof of an organic material. Alternatively, the organic layer 800 can be formed over the substrate 300 using a mechanical process. One mechanical process may include using an adhesive layer (not shown) on the substrate 300 or organic layer 800 and placing the organic layer 800 near the substrate 300 so that the adhesive layer lies between the organic layer 800 and substrate 300. Alternatively, the organic layer 800 can be placed over the substrate 300 and heated to allow the organic layer 800 and substrate 300 to fuse together. The processes described are only two of potentially many other mechanic processes that may be used.

Any one or more of the processes as previously described regarding the liquid compositions can be used to introduce guest material(s) or dye(s) into the organic layer 800. The liquid medium for the liquid composition(s) that include the guest material(s) or dye(s) have a higher surface energy compared to the organic layer 800. The liquid compositions may be placed on the organic layer 800 and act in a similar fashion as drops 402 and 404 when forming regions 502 and 504 in FIGS. 4 and 5. Referring to FIG. 8, red-doped regions 802 include a red guest material, green-doped regions 804 include a green guest material, and the blue-doped regions 806 include a blue guest material.

Formation of the rest of the organic electronic device is similar to any of the processes previously described above except that guest materials may or may not be added to organic layer 800. In one embodiment, the organic layer 800 includes organic active layer 850 that may emit substantially white light. The red-doped regions 802 may allow red light, and not green light or blue light, to be transmitted to the user side of the organic electronic device. The green-doped regions 804 and blue-doped regions 806 perform similar functions for green light and blue light, respectively.

If the organic electronic device includes radiation-responsive components, the red-doped regions 802 may allow red light, and not green light or blue light, to be transmitted through the organic layer 800 to the organic active layer 850. The green-doped regions 804 and blue-doped regions 806 perform similar functions for green light and blue light, respectively.

In a further embodiment (not shown), fabrication of the filter layer may be performed separate from base material 300. The fabrication process for an organic layer, similar to organic layer 800, may be performed and the organic layer with filter regions may be attached (using adhesive, fusion, other mechanical process, or any combination thereof) to the base material 300 before, during or after the formation of electronic components. In one embodiment, driver or other circuits may be formed over or within base material 300 before the filter layer is attached. After the filter layer is attached, the organic layers (e.g., organic active layer) for organic electronic components may be formed. In this manner, the organic active layer may not be exposed to relatively higher temperatures that are used to attach the filter layer to the base material 300.

In another embodiment not shown, the charge transport layer 340 and not the organic active layer 850 may include the guest materials. Although the charge transport layer 340 can be a filter layer in theory, it is typically not thick enough for a more conventional filter layer. Still, the guest material in the charge transport layer 340 can help to adjust color emission or reception by the organic active layer 850 so that it is closer to the wavelengths as specified in the Commission Internationale de l'Éclairage ("CIE") standards.

In still another embodiment, the positions of the first and second electrodes may be reversed. The second electrode 602 may be closer to the substrate 300 compared to the first electrodes 320. If radiation is to be transmitted through the second electrode 602, the thickness of the second electrode 602 may be reduced to allow sufficient radiation (at least 70%) to be transmitted through it.

In yet another embodiment, radiation may be emitted or received through a side of the organic electronic device opposite the base material 300 instead of or in addition to radiation being emitted or received through the base material side of the organic electronic device. In such a device, each of the second electrode 602 and the lid 622 may allow at least 70% of the targeted radiation to be emitted from or received by the organic active layer 350. The location of the desiccant 624 may be changed so that it does not overlie the first electrodes 320. Alternatively, the desiccant 624 may include one or more materials of a thickness(es) where at least 70% of the targeted radiation to be emitted from or received by the organic active layer 350 to pass through the desiccant 624.

In yet another embodiment, the second electrode 602 may be replaced by a plurality of second electrodes. Any one or more of the components in FIG. 6 may have its own second electrode or share the second electrode with some or all other components in an array.

5. Transistor Structures

Figure 9:
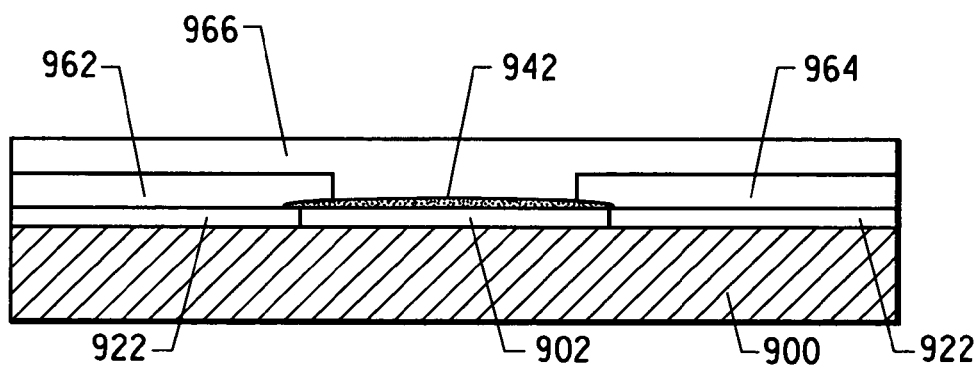
FIG. 9 includes an illustration of a cross-sectional view of a portion of a substrate including a field-effect transistor having a channel region formed from a liquid composition.

FIGS. 9–12 illustrate exemplary, non-limiting transistor structures that can be formed. In FIG. 9, a first electrode 902 is formed over a base material 900. The first electrode 902 acts as a gate electrode for a JFET and includes one or more conductive layers. The first electrode 902 can include one or more layers of materials conventionally used for gate electrodes within organic JFETs or MISFETs. Some exemplary materials for the gate electrode may include Ag, Al, Au, C (nanotubes and conductive organic polymers), Ge, Ir, Mo, Ni, Pd, Pt, Si, Ta, Ti, W, and any combination thereof. Those materials may or may not include dopants or other impurities that improve conductivity or adjust the work function of the first electrode 902. The first electrode 902 is formed using one or more of any number of different techniques including a conventional coating (e.g., spin coating), vapor deposition (chemical or physical), printing (ink jet printing, screen printing, solution dispensing, or any combination thereof), other deposition technique, or any combination thereof. The first electrode 902 can be formed as a patterned layer (e.g., using a stencil mask) or by depositing the layer(s) over all the base material 300 and using a conventional patterning sequence. The first electrode 902 has a thickness in a range of approximately 50–500 nm.

An insulating layer 922 is formed over the base material 900 and adjacent to the first electrode 902. The insulating layer 922 can include an organic material and is formed using one or more of any number of different techniques including a conventional coating (e.g., spin coating), printing (ink jet printing, screen printing, etc.), vapor deposition, other deposition process, or any combination thereof. The insulating layer 922 can be formed as a patterned layer (e.g., using a stencil mask) or by depositing the layer(s) over all the base material 900 and using a conventional patterning sequence. The insulating layer 922 has a thickness in a range of approximately 50–500 nm. Note that the insulating layer 922 can be formed before the first electrode 902.

The insulating layer 922 may include a fluorine material or may receive a fluorinated surface treatment as previously described to achieve the low surface energy. Alternatively, a surfactant (not shown) may be formed over the insulating layer 922. For the purposes of this specification, the surfactant may be considered part of the insulating layer 922. The insulating layer 922 has a lower surface energy compared to the first electrode 902.

A liquid composition is placed over the first electrode 902, and the liquid medium within the liquid composition is evaporated to form a channel region 942. The liquid composition may include any one or more of the liquid media previously describe. An organic active material may be dissolved, suspended, or dispersed within the liquid medium or is part of an emulsion. The organic active material includes one or more of the materials previously described as used for channel regions of transistors.

The exposed surface of the insulating layer 922 has a lower surface energy compared to the surface energy of the first electrode 902 and the liquid medium used in forming the channel region 942. The lower surface energy helps to constrain the liquid composition so that it overlies the first electrode 902 and none or a relatively insignificant portion of the insulating layer 922. If the surface energy of the first electrode 902 is higher than the surface energy of the liquid composition, the liquid composition may spread along the surface of the first electrode 902. The liquid composition can be retained in place by the insulating layer 922 due to its lower surface energy.

In a different embodiment (not shown), the liquid composition can be deposited as a series of drops over the first electrode 902 using an ink-jet printer. The series of drops can that coalesce to form the channel region 942. As seen from a plan view, the channel region 942 may be in range of 4–70 microns wide and nearly any length. In an alternative embodiment, the width may be smaller or larger.

After evaporation, second electrodes 962 and 964 are formed over the gate dielectric layer 922 and portions of the channel region 942. Each of the second electrodes 962 and 964 acts as a source region, a drain region, or source/drain regions. In one specific embodiment, the second electrode 962 acts as a drain region, and the second electrode 964 acts as a source region.

The second electrodes 962 and 964 can include one or more materials previously mentioned for the first electrode 902. Note that electrodes 902, 962, and 964 may include one or more dissimilar materials. In one embodiment, first electrode 902 includes Ni, and the second electrodes include Au. The thickness of the second electrodes 962 and 964 is in a range of approximately 100–1000 nm. The second electrodes 962 and 964 are formed using one or more of any number of different techniques including a conventional coating (e.g., spin coating), vapor deposition (chemical or physical), printing (ink jet printing, screen printing, solution dispensing, or any combination thereof, other deposition technique, or any combination thereof. The second electrodes 962 may be formed as a patterned layer (e.g., using a stencil mask) or by depositing the layer(s) over all the base material 900 and using a conventional patterning sequence.

Figure 10:
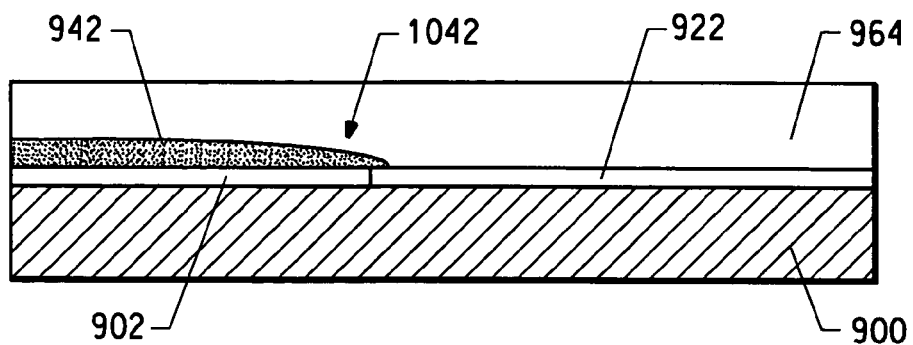
FIGS. 10 and 11 include illustrations of a cross-sectional view of a portion of an organic active layer for a channel region having a concave edge and a cusped edge, respectively.
Figure 11:
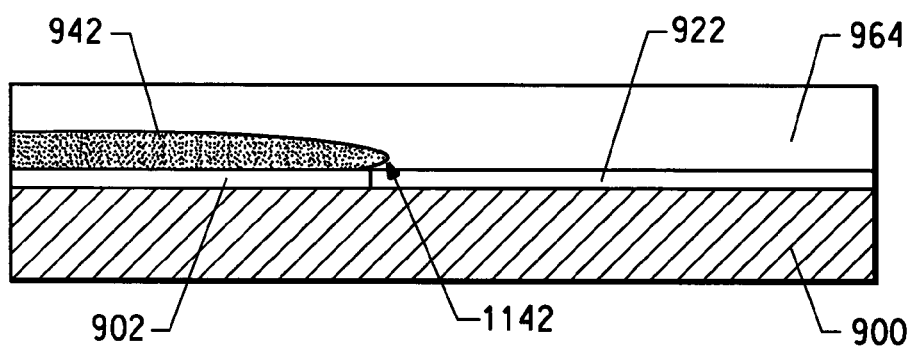

FIGS. 10 and 11 are enlarged views of the channel regions 1042 in accordance with two different embodiments. In FIG. 10, the channel region 942 may have a concave surface 1042 near the edge of the channel region 942. In FIG. 11, the channel region 942 may have a cusp 1142 near the edge of the channel region 942. The concave surface or cusp would not be seen with conventional organic-thin film transistors. With conventional organic-thin film transistors, the edge would be a substantially vertical edge (lithographic printing) or have a convex edge (from wet chemical etching). The concave surface 1042 is more likely to result when a liquid composition has a relatively higher concentration of a liquid medium, and the cusp 1142 is more likely to result when a liquid composition has a relatively lower concentration of a liquid medium.

Another insulating layer 966 is formed over the channel region 942 and second electrodes 962 and 964. The insulating layer 966 includes one or more materials conventionally used for passivation layer within electronic devices. Alternatively, the insulating layer 966 may include epoxy or other material(s) used sealing organic electronic devices. In one embodiment, the thickness of the insulating layer 966 is in a range of approximately 1–50 µm. The insulating layer 966 is formed using one or more of any number of different techniques including a conventional coating (e.g., spin coating), vapor deposition (chemical or physical), printing (ink jet printing, screen printing, solution dispensing, or any combination thereof, other deposition technique, or any combination thereof.

Figure 12:
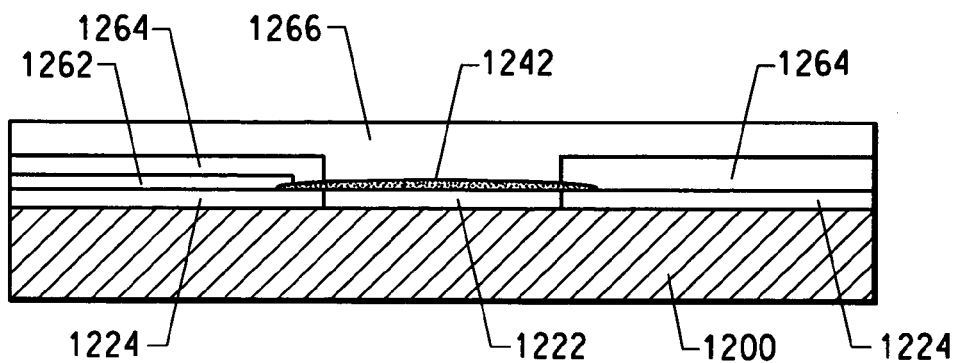
FIG. 12 includes an illustration of a cross-sectional view of a portion of a substrate including a bipolar transistor having a base region formed from a liquid composition.

FIG. 12 includes an illustration of a bipolar transistor that can be formed using the concepts described herein. A first electrode 1222 and a patterned insulating layer 1224 are formed over a base material 1200. The first electrode acts as an emitter region of the bipolar transistor. The emitter region 1222 and patterned insulating layer 1224 may include one or more layers of materials and be formed as previously described for the first electrode 902 and insulating layer 922, respectively. The order of formation of the emitter region 1222 and patterned insulating 1222 is not critical. In one embodiment, the thicknesses of the emitter region 1222 and patterned insulating layer 1224 are in a range of approximately 100–1000 nm.

A liquid composition may be placed over the emitter region 1222 and the patterned insulating layer 1224, and the liquid medium within the liquid composition may be evaporated to form an active base region 1242. The liquid composition may include a liquid medium previously described for a base region.

The exposed surface of the patterned insulating layer 1224 has a lower surface energy compared to the surface energy of the liquid medium used in forming the active base region 1242. The lower surface energy helps to constrain the liquid composition. In one embodiment, the liquid composition is deposited as a series of drops using an ink-jet printer. The series of drops can that coalesce to form the active base region 1242. As seen from a plan view, the active base region 1242 may be in range of 4–70 microns wide and nearly any length. In an alternative embodiment, the width may be smaller or larger.

An inactive base region 1262 and a patterned insulating layer 1264 can be sequentially formed. The inactive base region 1262 allows signals or other potentials from other circuitry (not shown) to bias the active base region 1242. The patterned insulating layer 1264 prevents the inactive base region 1262 from being electrically shorted to the subsequently formed collector region. In one embodiment, the thicknesses of the inactive base region 1262 and patterned insulating layer 1264 are in a range of approximately 100–1000 nm. The inactive base region 1262 and patterned insulating layer 1264 are formed using one or more of any number of different techniques including a conventional coating (e.g., spin coating), vapor deposition (chemical or physical), printing (ink jet printing, screen printing, solution dispensing, or any combination thereof), other deposition technique, or any combination thereof. The inactive base region 1262 and patterned insulating layer 1264 can be formed as a patterned layer (e.g., using a stencil mask) or by depositing the layer(s) over all the base material 1200 and using a conventional patterning sequence.

A collector region 1266 is formed over the active base region 1242 and patterned insulating layer 1264. The collector region 1266 includes one or more materials conventionally used for collector regions within electronic devices. The collector region 1266 is formed using one or more of any number of different techniques including a conventional coating (e.g., spin coating), vapor deposition (chemical or physical), printing (ink jet printing, screen printing, solution dispensing, or any combination thereof), other deposition technique, or any combination thereof. The collector region 1266 can be formed as a patterned layer (e.g., using a stencil mask) or by depositing the layer(s) over all the base material 1200 and using a conventional patterning sequence. In one embodiment, the thickness of the collector region 1266 is in a range of approximately 100–1000 nm. Although not shown, additional insulating or conductive layers may be form to substantially complete the organic electronic device.

6. Electronic Operation of the Organic Electronic Device

If the organic electronic components within the organic electronic device are radiation-emitting components, appropriate potentials are placed on the first electrodes 320 and second electrode 602. As one or more of the radiation-emitting components become sufficiently forward biased, such forward biasing can cause radiation to be emitted from the organic active layer 350. Note that one or more of the radiation-emitting components may be off during the normal operation of the organic electronic device. For example, the potentials and current used for the radiation-emitting components may be adjusted to change the intensity of color emitted from such components to achieve nearly any color within the visible light spectrum. Referring to the three first electrodes 320 closest to the right-hand side of FIG. 6, for red to be displayed, radiation-emitting component including region 502 will be on, while the other two radiation-emitting components are off. In a display, rows and columns can be given signals to activate the appropriate sets of radiation-emitting components to render a display to a viewer in a human-understandable form.

If the organic electronic components within the organic electronic device are radiation-responsive components, the radiation-responsive components may be reversed biased at a predetermined potential (e.g., second electrode 602 has a potential approximately 5–15 volts higher than the first electrode(s) 320). If radiation at the targeted wavelength or spectrum of wavelengths is received by the organic active layer, the number of carriers (i.e., electron-hole pairs) within the organic active layer increases and causes an increase in current as sensed by sense amplifiers (not shown) within the peripheral circuitry outside the array.

In a voltaic cell, such as a photovoltaic cell, light or other radiation can be converted to energy that can flow without an external energy source. The conductive members 220 and 502 may be connected to a battery (to be charged) or an electrical load.

For transistors, biasing conditions can depend on the specific application and physical dimensions. If a field-effect transistor is to act as a switch, a one volt difference may be maintained between the second electrodes 962 and 964 when the transistor is off (first electrode 902 is biased to $V_{dd}$ (e.g., 3.3 volts)). When the first electrode 902 (i.e, gate electrode) is at substantially the same potential as second electrode 964 (i.e., source region), current may flow between the source and drain regions due to the potential difference between the second electrodes 962 and 964. For a bipolar transistor, the base region 1242 may be biased approximately 0.3 volts higher than the emitter regions 1222, and the collector region 1266 may be biased approximately 5 volts higher than the base region 1242. After reading this specification, skilled artisans are capable of designing the electronic components, peripheral circuitry, and potentially remote circuitry to best suit their particular needs for their particular organic electronic device.

7. Advantages

The new process allows localized regions to be formed without well structures. Isolated drops can be used to form pixels in displays or sensor arrays. Sizes of the drops on a surface of a substrate can be lower than 70 microns, and sizes less than 4 microns are possible. In other embodiments, drops can be dispensed along a line. The drops may coalesce to form a line with a narrow dimension, such as 25 microns. The lines can be used to form fine-geometry portions of electronic components. Such portions can include channel regions, active base regions, conductors, resistors, and the like. Note that these structures may be formed without using lithographic printing or etching techniques. Spacings of such portions can be less than 100 microns.

In another embodiment, using drops with a liquid medium having a surface energy between the surface energies of two materials along a surface of a substrate may allow the drops to conform to the pattern of the material having the higher surface energy while the other material with lower surface energy can restrain motion of the drop to substantially prevent it from covering undesired portions of the substrate. In this manner, patterns with sharp bends can be formed with the drops. This combination of surface energies may allow feature sizes less than 4 microns even with existing liquid dispensing technologies.

The new process can be performed using existing equipment and can be integrated into an existing process without substantial modification of the process. Therefore, the new process can be implemented without significant risk of having to learn and characterize new equipment or creating undue complications during process integration.

EXAMPLES

The following specific examples are meant to illustrate and not limit the scope of the invention.

Example 1

This Example illustrates polymerization of ethylenedioxythiophene in the presence of Nafion® to create a material for a low surface energy charge transport layer.

142.68 g (16.03 mmoles of Nafion® monomer units) SE-10072 and 173.45 g deionized water were poured into a 500 mL Nalgenic® plastic bottle. A stock solution of ferric sulfate was made first by dissolving 0.0667 g ferric sulfate hydrate (97%, Sigma-Aldrich Corp., St. Louis, Mo., USA) with deionized water to a total weight of 12.2775 g. 1.40 g of the ferric sulfate solution and 1.72 g (7.224 mmoles) sodium persulfate (Fluka, Sigma-Aldrich Corp., St. Louis, Mo., USA) were then placed into the plastic bottle. The cap of the Nalgenic® plastic bottle was replaced tightly and the bottle was the shaken vigorously by hand. The bottle contents were poured into a jacketed 500 mL three-necked flask as described above. The mixture was then stirred for 30 minutes in the reaction vessel. 0.63 mL (5.911 mmoles) of Baytron-M (a trade name for 3,4-ethylenedioxythiophene from Bayer, Pittsburgh, USA) was added to the reaction mixture with stirring. Polymerization was allowed to proceed with stirring at about 23° C. In one hour and 7 minutes, the polymerization liquid turned very dark blue and was then distributed into two 250 mL plastic bottles. When dismantling the reaction vessel, no gel particles were noticed on the stirring shaft or on the glass wall of the reaction vessel. Total yield of the polymerization liquid was 297.10 g. The liquid contains 5.303% (w/w) solids assuming no loss and total conversion. The solid is presumed to contain primarily poly(3,4-ethylenedioxythiophene), PEDOT/Nafion®.

148.75 g of the aqueous PEDOT/Nafion® in one of the two plastic bottles was further treated with two ionic exchange resins. One of the two resins is Lewatit® S100, a trade name from Bayer, Pittsburgh, Pa., USA for sodium sulfonate of crosslinked polystyrene. The other ionic exchange resin is Lewatit® MP62 WS, a trade from Bayer, Pittsburgh, Pa., USA for free base/chloride of tertiary/quaternary amine of crosslinked polystyrene. Before use, the two resins were washed with deionized water separately until there was no color observed in the water. 7.75 g of Lewatit® S100 and 7.8 g of Lewatit® MP62® WS were then mixed with the 148.75 g aqueous PEDOT/Nafion® dispersion in a plastic bottle. The bottle was then placed on a roller for stirring for about 23 hours. The resulting slurry was then suction-filtered through a coarse fritted-glass funnel. Yield was 110.2 g. Based on elemental analysis of the sample dried from a 2.6% (w/w) dispersion, the sample contains 21.75% carbon, 0.23% hydrogen, 1.06% nitrogen and 2.45% sulfur. Other elements such as oxygen and fluorine were not analyzed. To remove fluorine interference with sulfur analysis, $CeCl_3$ and a cation exchange resin was added.

Example 2

This Example demonstrates that inkjet printing organic active solutions onto a low surface-energy charge transport layer results in approximately six times smaller drop formation than printing onto a standard (non-fluorinated) charge transfer layer.

In Example 2, organic electronic components are fabricated to include the following structure: ITO (first electrodes or anodes)/charge transport/organic active/second electrode (cathode). The substrates are 30×30 mm (nominal) ITO (first electrodes) coated glass base material. Well structures are not formed in Example 2. A charge transport layer of PEDOT/Nafion® is coated over the glass base material and ITO. The charge transport layer has a surface energy of approximately 26 mN/m. After the charge transport layer is dried, drops of a typical light-emitting polymer ink, Green 1300 Series polyfluorene (Dow Chemical Co., Midland, Mich.) dissolved in 4-methyl anisole at a concentration of approximately 0.65%, are ink-jet printed onto the charge transport layer. The 4-methyl anisole has a surface energy of approximately 30 mN/m. The drop volume is approximately 50 pL. The drops spread to a radius of approximately 15 microns.

As a point of comparison, Example 2 is repeated except that a typical, high surface energy charge transport layer of PEDOT (BAYTRON-P, Bayer AG, Germany) is used. The BAYTRON-P layer has a surface energy of approximately 65 mN/m. After the BAYTRON-P layer is dried, drops of the same light-emitting polymer ink, Green 1300 Series polyfluorene dissolved in 4-methyl anisole at a concentration of 0.65%, is ink-jet printed onto the layer. The drop volume is approximately 50 pL. The drops spread to a radius of approximately 81 microns.

Modern print heads are capable of much smaller drop volumes (closer to 10 pL) and future print heads are expected to deliver approximately 1 pL drops. At 1 pL, drops may spread to a radius of only approximately 4 microns.

Example 3

This Example demonstrates that well structures are not required and higher resolution displays may be made without the well structures.

In Example 3, the substrate is a 30×30 mm (nominal) ITO (first electrodes 320) coated glass base material 300 in FIG. 7. A charge transport layer 740 of PEDOT/Nafion® is coated over the glass base material and ITO. After drying, the charge transport layer 740 has a surface energy of approximately 26 mN/m and is approximately 351 nm thick. Drops of a light-emitting polymer ink, Green 1300 Series polyfluorene dissolved in 4-methyl anisole at a concentration of approximately 0.65%, are ink-jet printed onto the charge transfer layer.

The 4-methyl anisole has a surface energy of approximately 30 mN/m. The drop volume is approximately 50 pL. The lower surface energy of the charge transport layer 740 (compared to the drops of the organic active layers) helps to constrain the drops of the organic active layers 754, thus obviating the need for well structures. Organic active layers 752 and 756, second electrodes (not shown in FIG. 7) and other layers may be formed to complete fabrication.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. An organic electronic component comprising:
   a substrate having a surface with a first portion and a second portion, without a well structure connected to or adjacent the first portion of the surface or the second portion of the surface, wherein the first portion of the surface has a first surface energy and the second portion of the surface has a second surface energy;
   a liquid composition covering the first portion of the surface and contacting the second portion of the surface, wherein the liquid composition has a third surface energy that is higher than the first surface energy and lower than the second surface energy; and
   an organic active material.

2. The organic electronic component of claim 1, wherein the liquid composition includes an organic active material.

3. The organic electronic component of claim 1, wherein the second portion includes a charge transport layer.

4. The organic electronic component of claim 1, wherein the first portion includes an insulating layer and the second portion includes an electrode.

5. The organic electronic component of claim 1, wherein the first portion of the surface includes a surfactant.

6. The organic electronic component of claim 5, wherein the surfactant includes a fluorine containing material.

* * * * *